United States Patent [19]
Bhat

[11] Patent Number: 5,946,582
[45] Date of Patent: Aug. 31, 1999

[54] METHOD OF MAKING AN INP-BASED HETEROJUNCTION BIPOLAR TRANSISTOR WITH REDUCED BASE-COLLECTOR CAPACITANCE

[75] Inventor: Rajaram Bhat, Middletown, N.J.

[73] Assignee: Telcordia Technologies, Inc., Morristown, N.J.

[21] Appl. No.: 08/873,408

[22] Filed: Jun. 12, 1997

[51] Int. Cl.[6] .................................................. H01L 21/328
[52] U.S. Cl. .......................... 438/311; 438/316; 438/320
[58] Field of Search ..................... 438/311, 316, 438/320, FOR 165, FOR 166

[56] References Cited

U.S. PATENT DOCUMENTS

| | | |
|---|---|---|
| 4,954,457 | 9/1990 | Jambotkar . |
| 5,087,580 | 2/1992 | Eklund . |
| 5,620,907 | 4/1997 | Jalali-Farahani et al. . |
| 5,736,417 | 4/1998 | Oki et al. . |
| 5,739,062 | 4/1998 | Yoshida et al. . |

OTHER PUBLICATIONS

Asbeck, *High-Speed Semiconductor Devices*, ed. Sze (Wiley, 1990), pp. 335–338, 358–366, and 370–388.

Miyamoto et al., "Reduction of Base–Ccollector Capacitance by Undercutting the Collector and Subcollector in GaInAsInP DHBT's," *IEEE Electron Device Letters*, vol. 17, Mar. 1996, pp. 97–99.

Swaminathan et al, *Materials Aspects pf GaAs and InP Based Materials: InP, InAs, GaAs, GaP, InGaAs, and InGaAsP*, (Prentice Hall, 1991), pp. 116–131, 175–177.

*Primary Examiner*—George R. Fourson
*Attorney, Agent, or Firm*—Joseph Giordano; David A. Hey; Elizabeth A. Mark

[57] ABSTRACT

A heterojunction bipolar transistor based on the InP/InGaAs materials family and its method of making. An n-type collector layer, principally composed of InP is epitaxially grown on an insulating InP substrate by vapor phase epitaxy. The collector layer is then laterally defined into a stack, and semi-insulating InP is regrown around the sides of the stack to the extent that it planarizes with the stack top. The semi-insulating InP electrically isolates the collector stack. A thin base layer of p-type InGaAs, preferably lattice matched to InP, is grown over the collector stack, and an n-type emitter layer is grown over the base layer. A series of photolithographic steps then defines a small emitter stack and a base that extends outside of the area of the emitter and collector stacks. The reduced size of the interface between the base and the collector produces a lower base-collector capacitance and hence higher speed of operation for the transistor.

12 Claims, 4 Drawing Sheets

METHOD OF MAKING AN INP-BASED HETEROJUNCTION BIPOLAR TRANSISTOR WITH REDUCED BASE-COLLECTOR CAPACITANCE

RELATED APPLICATION

This application claims the benefit of U.S. Provisional Application No. 60/035,219, filed Jan. 7, 1997.

FIELD OF THE INVENTION

The invention relates generally to semiconductor transistors. In particular, the invention relates to heterojunction bipolar transistors.

BACKGROUND ART

Heterojunction bipolar transistors (HBTs) offer much higher speed of operation than the more prevalent metal-oxide-semiconductor field-effect transistors (MOSFETs) or even conventional homojunction bipolar transistors, e.g., npn or pnp silicon transistors. In some applications where a high degree of linearity is required, HBTs are the alternative technologies of metal semiconductor field effect transistors (MESFETs) and high electron mobility transistors (HEMTs). The use of different materials of differing bandgaps for the collector, base, and emitter provides design flexibility.

The most common HBT technology is based on the GaAs/GaAlAs material family, several features of which are explained by Asbeck in *High-Speed Semiconductor Devices*, ed. Sze (Wiley, 1990), pp. 335–338, 358–366, and 370–384.

Asbeck describes one such GaAs HBT, ibid, p. 376, as shown in the cross-sectional view of FIG. 1. Over a semi-insulating GaAs substrate 10 is formed an $n^+$-type collector contact layer 12, to which a collector contact C is applied. An $n^-$-type collector layer 14 and a $p^+$-type base layer 16 of GaAs or GaAlAs is grown thereover. A small $n^-$-type emitter 18 is formed over the base layer 16. An emitter contact E is applied to the emitter 18, and a ring or multiple base contacts B are applied to the base layer 16.

A disadvantage of the structure described thus far is that the active area is determined by the area of the emitter 18, but the parasitic capacitance is largely determined by the much larger area of the interface between the base and collector layers 16, 14. One method for reducing the base-collector capacitance implants protons into an annular area 20 of the collector layer 14 surrounding the emitter 18 so as to render the implanted area 20 electrically insulating. Asbeck reported a reduction of the capacitance by a factor of two by using proton implantation.

Another HBT technology is based on the InP/InGaAs material family, as is explained by Asbeck, ibid., pp. 384–388. HBTs composed of this material family offer higher speed and can be integrated with opto-electronic devices that are sensitive in the 1.3 and 1.5 μm optical bands, which have become so important for fiber optic communications. However, InP-based heterojunction bipolar transistors similarly suffer from high base-collector capacitance, and proton implantation has proved ineffective in rendering InP to be insulating or semi-insulating.

Miyamoto et al. have addressed this problem in InP-based HBTs in "Reduction of Base-Collector Capacitance by Undercutting the Collector and Subcollector in GaInAsInP DHBT's," *IEEE Electron Device Letters*, vol. 17, March 1996, pp. 97–99. By use of a selective etchant, they substantially etched the collector layer under the base layer so as to undercut the edges of the base layer. To provide some mechanical integrity, they then backfilled with polyimide. The reduced size of the collector, together with the lower dielectric constant of the polyimide, reduced the base-collector capacitance. They also reported a reduction of capacitance by about a factor of two. However, the robustness of this structure remains in question.

SUMMARY OF THE INVENTION

Accordingly, an object of the invention is to provide a heterojunction bipolar transistor that exhibits a lower base-collector capacitance.

It is a further object of the invention to provide such a transistor based on the InP/InGaAs family of materials.

An accompanying object of the invention is to provide a method of making such a transistor.

The invention can be summarized as a bipolar transistor, particularly an InP-based heterojunction bipolar transistor and its method of making in which the collector epitaxially grown on the substrate is initially laterally defined and then insulating material, e.g. Fe-doped InP, is regrown around its edges to produce a planar surface on the top of the collector and the insulating material. The thin base layer and the emitter layer are then sequentially epitaxially deposited over the defined collector and its surrounding insulating material. The base and emitter layer are laterally defined over the collector to form both a bipolar transistor stack and contacts extending to respective sides of the base and emitter.

BRIEF DESCRIPTION OF THE DRAWINGS

FIG. 7 is a plan view of the heterojunction bipolar transistor of FIG. 6, wherein FIG. 6 is a cross section taken along section line 6—6 of FIG. 7.

DETAILED DESCRIPTION OF THE PREFERRED EMBODIMENTS

One embodiment of the invention uses approximately the same active, vertical layered structure as in the prior art, but achieves horizontal confinement via a regrowth process. As illustrated in the cross-sectional view of FIG. 2, a horizontally undefined collector structure is epitaxially deposited on a semi-insulating InP substrate 30. It is known that semiconducting InP can be made semi-insulating by doping it with iron (Fe). That is, its semiconductor resistivity is so high as to render it effectively electrically insulating. Grabbe et al. disclose the details of the vertical structure for both a single HBT and for a double HBT in U.S. patent application Ser. No. 08/850,260, entitled "Production-Worthy Method of Fabricating a Heterojunction Bipolar Transistor and Product Thereof" filed May 5, 1997, incorporated herein by reference.

The collector structure includes a very highly doped $n^{++}$-type layer 32 of InGaAs, a highly doped $n^+$-type layer 34 of InP, and a lesser doped n-type layer 36 of InP. Although the invention is not so limited, in this embodiment all the InGaAs layers are substantially lattice matched to InP, that is, $In_{0.53}Ga_{0.47}As$.

Figure 1:
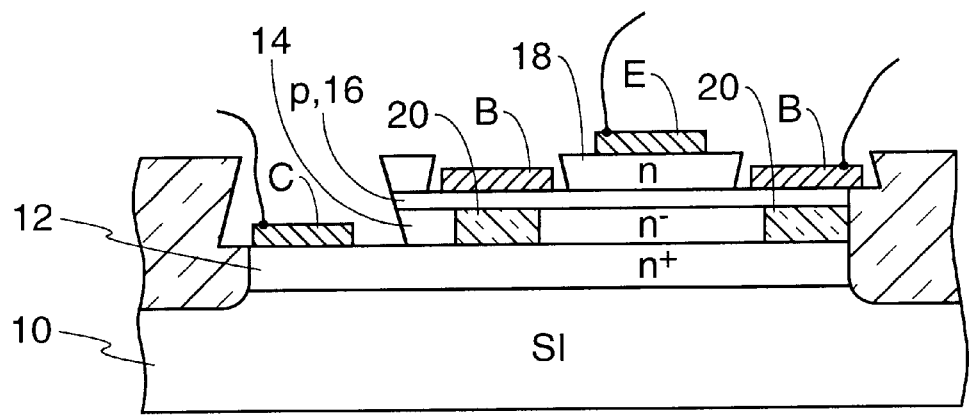
FIG. 1 is a cross-sectional view of a GaAs-based heterojunction bipolar transistor (HBT) of the prior art.
Figure 2:
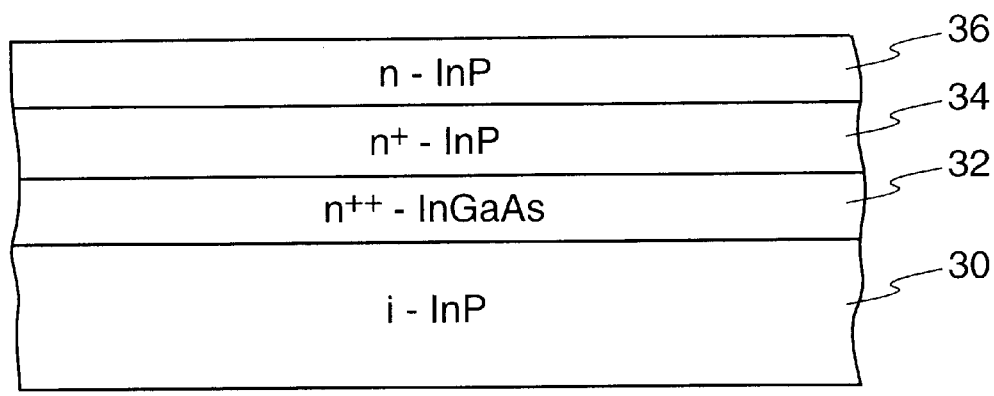
FIGS. 2 through 6 are cross-sectional views illustrating the steps in forming a first embodiment of a heterojunction bipolar transistor of the invention.
Figure 3:
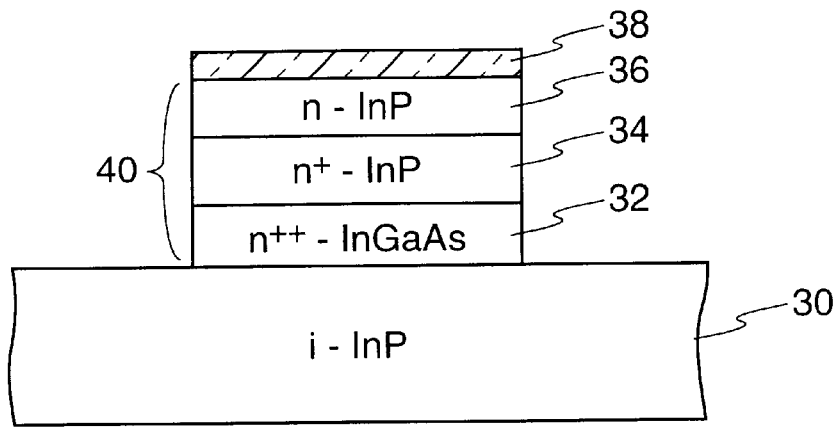

A layer of $SiO_2$ or $Si_3N_4$ is deposited over the collector structure of FIG. 2 and is photolithographically defined into a hard mask 38 illustrated in the cross-sectional view of FIG. 3. Two selective wet etchants are used for room temperature etching. The first one $HCl/H_3PO_4$ (1:3, by volume) etches InP but stops on InGaAs. The second one $H_2SO_4/H_2O_2/H_2O$ (5:1:1 by volume) etches InGaAs but stops on InP. Wet etching around the hard mask 38 produces a collector stack 40 rising above the substrate 30. Alternatively, reactive ion etching can be used to etch through the InP and part way into the InGaAs, and then the selective wet etchant completes the etch through the InGaAs and stops on the InP substrate. The collector stack 40 includes not only the principal stack for the active area of the HBT but also, as will become evident later, a side area for contacting the collector.

Figure 4:
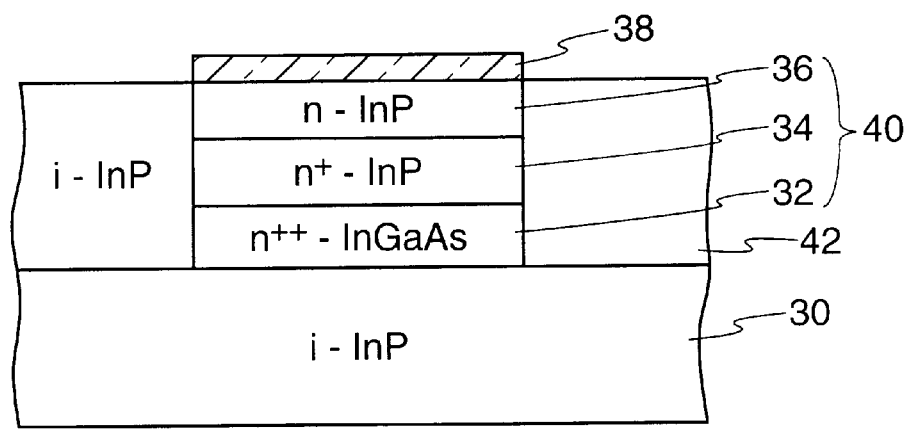

As illustrated in the cross-sectional view of FIG. 4, a layer 42 of semi-insulating InP, preferably Fe-doped, is regrown over the substrate 30 and around the collector stack 40. Prior to regrowth, the substrate 30 is soaked in concentrated $H_2SO_4$ for 1 to 3 minutes to remove any residual organic contaminants. It can also be subjected to a UV ozone treatment to remove the organics. If hydride vapor phase epitaxy or chloride vapor phase epitaxy is used for the regrowth, the regrown InP layer 42 can be grown to be substantially planar with the top of the collector stack 40. These two growth techniques are described by Swaminathan et al. in *Materials Aspects of GaAs and InP Based Materials: InP, InAs, GaAs, GaP, InGaAs, and InGaAsP*, (Prentice Hall, 1991), pp. 116–131, 175–177. The semi-insulating InP 42 electrically isolates the collector stack 40.

Thereafter, the hard mask 38 is stripped with HF in the case of an $SiO_2$ mask. Before the next regrowth step, the exposed InP may be slightly etched with $HCl/H_3PO_4$ (1:3 by volume) to provide a clean surface. Then, as illustrated in the cross-sectional view of FIG. 5, laterally undefined layers for the base and emitter are epitaxially grown (regrown) over both the top of the collector stack 40 and the regrown semi-insulating InP 40. The base is formed from a thin base layer 44 of very highly doped $p^{++}$-type InGaAs. Its thickness may be in the range of 30 to 100 nm, depending on the speed required and the level of $p^{++}$-type doping available. The laterally undefined emitter structure includes a moderately doped n-type layer 46 of InP, a highly doped $n^+$-type layer 48 of InP, and a very highly doped $n^{++}$-type layer 50 of InGaAs. The top two layers 48, 50 act as the emitter contact.

Figure 5:
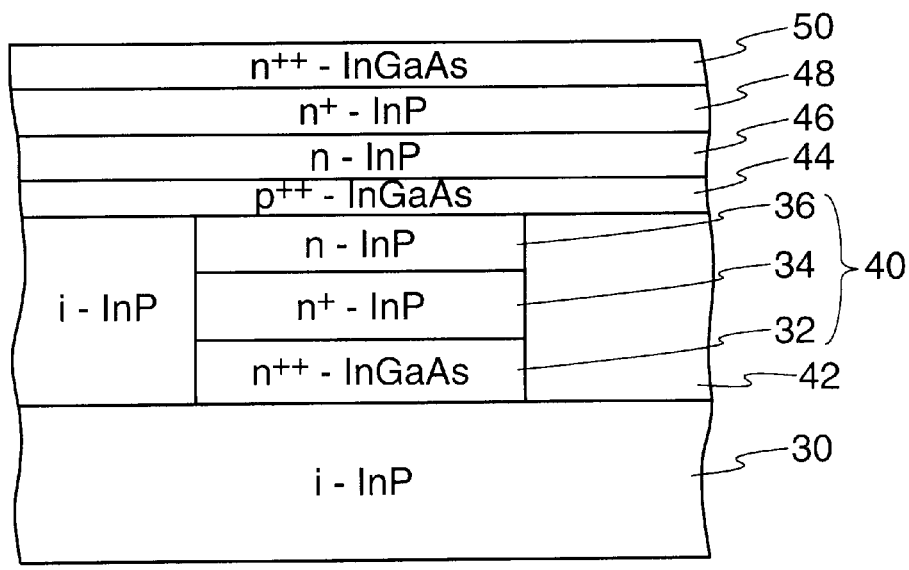
Figure 6:
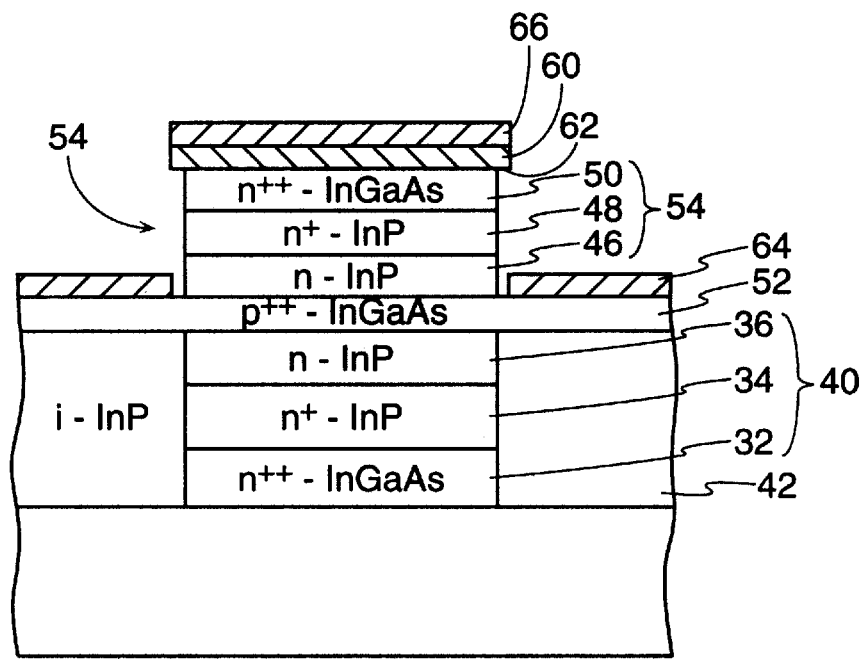

The processing of the planar structure of FIG. 5 into a transistor closely follows the process described by Grabbe et al., ibid. This process then defines the base 52 and emitter stack 54 illustrated in the cross-sectional view of FIG. 6 and as further illustrated in the cross-sectional view of FIG. 8, which also shows the collector area as well as one level of dielectric and metallization.

Figure 7:
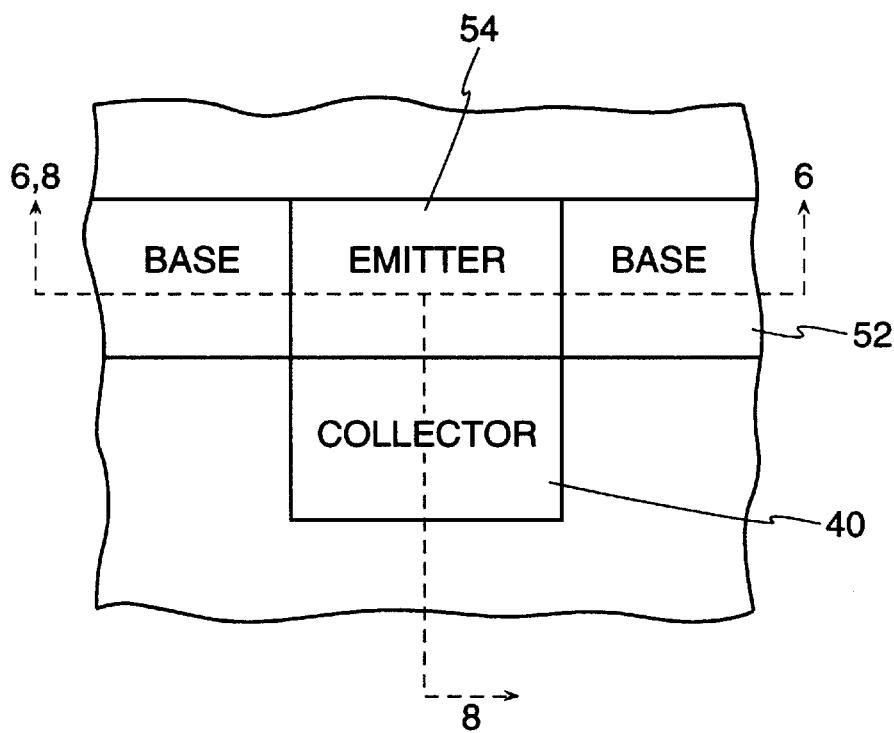

As illustrated in the plan view of FIG. 7, the collector 40, the base 52, and the emitter 54 are not coextensive. The base 52 and collector 40 underlie all of the area of the emitter 54 in the area of the principal stack, but have respective portions extending in orthogonal directions to the sides to provide contacting areas. Importantly, the collector 40 and base 52 vertically abut only in the principal stack area directly under the emitter 54 and a small area extending toward the collector, as required by the lithography and other feature definition. The small area minimizes the collector-base capacitance. The base contact may be made semi-annular, rather than the illustrated double sided, to reduce the base resistance and to improve the uniformity of current injection. However, these advantages must be weighed against any accompanying increases in the collector-base capacitance In a first portion of the process for defining the base 52 and emitter 54, an emitter ohmic contact 60 shown in FIG. 6 composed of a metal is deposited and defined over $n^{++}$-type layer 50 of FIG. 5 in the area of the intended emitter stack 54. A first selective etchant removes the exposed InGaAs layer 50, and then the second selective etchant removes the exposed InP layers 48, 46, stopping on the as yet laterally undefined base layer 44 of FIG. 5, which will become the base 52 of FIGS. 6 and 7. The etching undercuts the emitter ohmic contact 60 to produce an overhang 62.

Then a base ohmic metal is directionally deposited using the emitter ohmic contact 60 as part of the mask. The base ohmic metal is deposited as a principal base ohmic contact 64 over the base layer 44 and a second base ohmic portion 66 over the emitter ohmic contact 60. The overhang 62 self-aligns the base ohmic contact 64 with the emitter stack 54 with an insulating gap in between.

Figure 8:
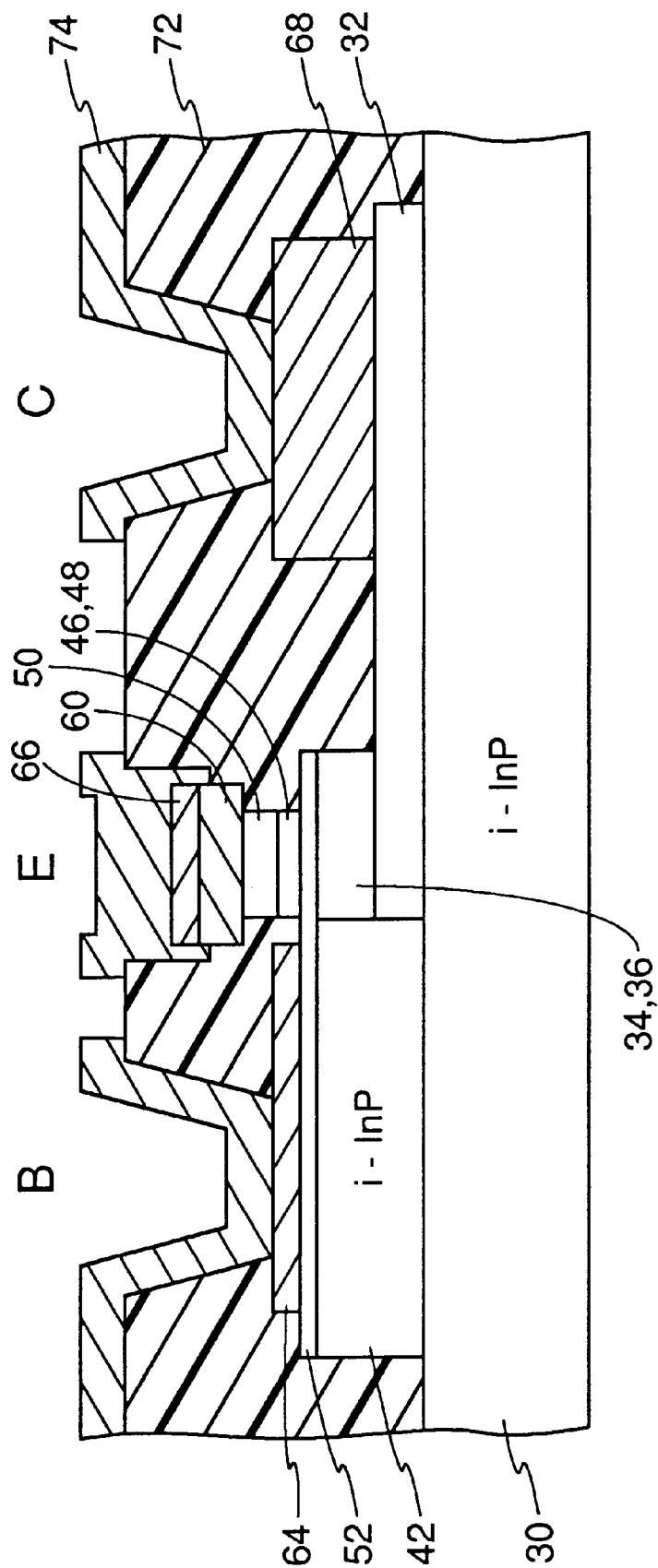
FIG. 8 is a cross-sectional view of the heterojunction transistor of FIGS. 6 and 7, taken along section line 8—8 of FIG. 7.

Referring to FIG. 8, two photolithographic etching steps produce a base mesa and a collector mesa. A collector ohmic contact 68 is deposited and photolithographically defined over the $n^{++}$-InGaAs layer 32 of the collector. An insulating layer 72, preferably of a bakeable polymeric dielectric, is deposited and planarized. Via holes are etched through the insulating layer 72 and one or more metallization layers are deposited into the vias and on top of the insulating layer 72 and defined for base, emitter, and collector metallization contacts B, E, C to the underlying metal ohmic contacts 54, 66, 68 respectively and for interconnects to other parts of the integrated circuit. Note that the emitter metallization contact E may be made substantially larger than the size of emitter ohmic contact portions 66, 60, the smallest feature to be contacted, and may drop over their sides so that the alignment for the metallization is relatively relaxed.

It is further noted that the process eliminates or reduces alignment requirements. The emitter ohmic contact 62 acts as the etching mask for forming the emitter stack and thus is self-aligned to it. The overhang 62 of the emitter ohmic contact 62 self-aligns the base ohmic contact 64. The most critical alignment is between the emitter ohmic contact 62 and the underlying principal collector stack, which does not need to be precise.

Although the invention has been described with reference to an HBT based on the InP family of materials, the invention is not so limited. Other materials may be employed, such as the GaAs family of materials. Indeed, the structure and process may be used with homojunction transistors.

It is thus seen that the heterojunction bipolar transistor of the invention enjoys a much reduced area of interface between the base and collector. The reduction in base-collector capacitance allows the transistor of the invention to operate at much higher speeds. The method for achieving this beneficial structure is relatively simple and does not offer significant complications over the fabrication method of the prior art. Although the inventive method does require regrowth, the active portion of the base layer, that is, the portion overlying the collector stack, is regrown over layers that have not been necessarily etched.

What is claimed is:

1. A method of fabricating a bipolar transistor, comprising the steps of:

depositing a first layer of a first conductivity type over a substrate;

laterally defining said first layer into a first stack;

depositing an insulating layer onto said substrate around said first stack;

depositing a second layer of a second conductivity type over said first stack and over said insulating layer; and depositing a third layer of said first conductivity type over said second layer.

2. The method of claim 1, wherein said first and third layers comprise InP and said second layer comprises InGaAs.

3. The method of claim 1, wherein said first and second layers comprise InGaAs and said third layer comprises InP.

4. The method of claim 1, wherein said insulating layer comprises a semi-insulating semiconductor and said step of depositing said second layer is an epitaxially depositing step.

5. The method of claim 4, wherein said step of depositing said insulating layer comprises either hydride or chloride vapor phase epitaxy, whereby a substantially planarized surface is achieved.

6. The method of claim 1, further comprising:

defining said second layer to have a central area overlying a first portion of said first layer and a second tab area extending to a second side of said central area, a first tab area of said first layer being exposed on a first side of said central area; and defining said third layer to overlie said central area but not said first and second tab areas.

7. The method of claim 6, wherein said step of defining said third layer comprises:

depositing and defining a first metal contact layer over said third layer; and etching through said third layer with said metal contact layer acting as a mask.

8. The method of claim 7, wherein said etching step undercuts said first metal contact layer and further comprising directionally depositing a second metal contact layer over said first metal contact layer and over said second layer.

9. The method of claim 8, further comprising:

depositing an insulating layer over said second metal contact layer;

etching an aperture through said insulating layer to expose a top and a side portion of said second metal contact layer deposited over said first metal contact layer; and depositing a metal into said aperture.

10. The method of claim 6, wherein at least one of said first, second, and third layers comprises indium, gallium, and arsenic and at least another of said first, second, and third layers comprises indium and phosphorous.

11. A method of fabricating a bipolar heterojunction transistor, comprising the steps of:

providing a vertical semiconductor structure comprising InP and InGaAs and having a semi-insulating InP substrate and an n-type collector layer epitaxially formed over said substrate, said collector layer comprising a material chosen from the materials group consisting of InP and InGaAs;

etching through portions of said collector layer to form a stack of said collector layer rising above said substrate;

regrowing a semi-insulating layer comprising InP over said substrate to be approximately planar with a top of said stack;

regrowing a base layer and then a collector layer over said stack and over said semi-insulating layer, said base and collector layers comprising materials chosen from said materials group;

depositing a first metal layer on said collector layer and defining therefrom a first metal contact at least partially overlying a portion of said stack;

etching through said collector layer using said first metal contact as a mask, said etching undercutting said first metal contact;

directionally depositing a second metal layer over said first metal contact and areas of said base layer not shadowed by said first metal contact, thereby forming a second metal contact on said base layer; and exposing a portion of said collector layer and forming a third metal contact thereupon.

12. The method of claim 11, further comprising:

depositing an insulating layer over said first, second, and third metal contacts;

defining an aperture through said insulating layer to said second metal layer overlying said first metal contact, a size of said aperture being larger than said first metal contact and said aperture extending below a top of said second metal layer overlying said first metal contact; and filling a metal into said aperture.

* * * * *

UNITED STATES PATENT AND TRADEMARK OFFICE
CERTIFICATE OF CORRECTION

| | |
|---|---|
| PATENT NO. | : 5,946,582 |
| APPLICATION NO. | : 08/873408 |
| DATED | : August 31, 1999 |
| INVENTOR(S) | : Bhat |

It is certified that error appears in the above-identified patent and that said Letters Patent is hereby corrected as shown below:

On the title page, insert --(60) Related U.S. Application Data – Provisional application No. 60/035,782, filed on January 7, 1997.--

Column 1, line 8, "60/035,219" should read --60/035,782--.

Signed and Sealed this

Fourteenth Day of April, 2009

JOHN DOLL
*Acting Director of the United States Patent and Trademark Office*